(12) United States Patent
Wei et al.

(10) Patent No.: US 10,966,347 B2
(45) Date of Patent: Mar. 30, 2021

(54) LIQUID COOLING DEVICE

(71) Applicant: COOLER MASTER TECHNOLOGY INC., New Taipei (TW)

(72) Inventors: Yu-Te Wei, New Taipei (TW); Shui-Fa Tsai, New Taipei (TW)

(73) Assignee: COOLER MASTER TECHNOLOGY INC., New Taipei (TW)

(*) Notice: Subject to any disclaimer, the term of this patent is extended or adjusted under 35 U.S.C. 154(b) by 363 days.

(21) Appl. No.: 15/878,053

(22) Filed: Jan. 23, 2018

(65) Prior Publication Data
US 2018/0343771 A1  Nov. 29, 2018

(30) Foreign Application Priority Data

May 26, 2017 (TW) .................................. 106207587

(51) Int. Cl.
*F16L 27/08* (2006.01)
*H05K 7/20* (2006.01)
*G06F 1/20* (2006.01)
*F28F 9/26* (2006.01)
*H01L 23/473* (2006.01)

(52) U.S. Cl.
CPC .......... *H05K 7/20272* (2013.01); *F28F 9/26* (2013.01); *G06F 1/20* (2013.01); *H01L 23/473* (2013.01); *G06F 2200/201* (2013.01)

(58) Field of Classification Search
CPC ......... F16L 27/08; F16L 37/14; F16L 37/142; F16L 37/144; F16L 27/0837; F16L 27/0841; F16L 27/0845; F16L 43/02; F16L 43/001; F16L 43/005

USPC ......... 285/139.1, 139.2, 139.3, 120.1, 121.3, 285/319, 305, 124.4, 124.5, 134.1, 135.1, 285/135.4; 62/259.2
See application file for complete search history.

(56) References Cited

U.S. PATENT DOCUMENTS

| | | | | |
|---|---|---|---|---|
| 2,137,223 A | * | 11/1938 | Baxter | F16L 41/14 285/139.1 |
| 2,269,431 A | * | 1/1942 | Allen | F16L 27/0804 285/276 |
| 3,064,998 A | * | 11/1962 | Syverson | F16N 21/00 285/101 |
| 3,560,027 A | * | 2/1971 | Graham | F16L 41/03 285/130.1 |
| 4,811,975 A | * | 3/1989 | Paul, Jr. | F16L 37/144 285/305 |

(Continued)

*Primary Examiner* — Aaron M Dunwoody
(74) *Attorney, Agent, or Firm* — Maschoff Brennan (57) ABSTRACT

A liquid cooling device includes body. The body has liquid inlet and liquid outlet. The liquid outlet has first internal thread on its inner wall. The liquid inlet has second internal thread on its inner wall. Another liquid cooling device has body, first thread adapter and second thread adapter. The first thread adapter is movably disposed on the liquid outlet, and has a first internal thread on its inner wall. The second thread adapter is movably disposed on the liquid inlet, and has a second internal thread on its inner wall. Still another liquid cooling device has a body. The body has a liquid passage. The liquid passage has internal thread on its inner wall. Yet another liquid cooling device has body and thread adapter. The body has a liquid passage. The thread adapter is movably disposed on the liquid passage, and has internal thread on its inner wall.

5 Claims, 8 Drawing Sheets

(56) References Cited

U.S. PATENT DOCUMENTS

| | | | | |
|---|---|---|---|---|
| 5,964,483 A | * | 10/1999 | Long | F16L 37/144 |
| | | | | 285/305 |
| 8,801,047 B2 | * | 8/2014 | Phillips | B65H 75/4478 |
| | | | | 137/355.26 |
| 2003/0038479 A1 | * | 2/2003 | Huang | F15B 21/048 |
| | | | | 285/305 |
| 2003/0127853 A1 | * | 7/2003 | Haymon | F16L 41/14 |
| | | | | 285/139.1 |
| 2003/0193187 A1 | * | 10/2003 | Takada | F16L 37/56 |
| | | | | 285/120.1 |
| 2007/0090643 A1 | * | 4/2007 | Cheng | F16L 27/093 |
| | | | | 285/190 |
| 2008/0012327 A1 | * | 1/2008 | Spears | A62C 35/68 |
| | | | | 285/355 |
| 2009/0079188 A1 | * | 3/2009 | Mitsui | F16B 39/20 |
| | | | | 285/305 |
| 2009/0218808 A1 | * | 9/2009 | Krohn | F16L 19/0212 |
| | | | | 285/45 |
| 2013/0014963 A1 | * | 1/2013 | Porta | E21F 5/00 |
| | | | | 169/64 |
| 2015/0338001 A1 | * | 11/2015 | Bush | F16L 21/06 |
| | | | | 285/179 |
| 2018/0043317 A1 | * | 2/2018 | Kimberlin | F04B 53/22 |
| 2018/0283576 A1 | * | 10/2018 | Zhang | E03C 1/021 |
| 2019/0072342 A1 | * | 3/2019 | Tsai | F28F 9/0248 |

\* cited by examiner

LIQUID COOLING DEVICE

CROSS-REFERENCE TO RELATED APPLICATIONS

This non-provisional application claims priority under 35 U. S. C. § 119(a) on Patent Application No(s). 106207587 filed in Taiwan on May 26, 2017, the entire contents of which are hereby incorporated by reference.

TECHNICAL FIELD

The disclosure relates to a liquid cooling device.

BACKGROUND

Generally, electronic devices have processors to process and analyze data. As the processing ability of the processors improves, the processors generate more heat. If heat is not removed fast enough from the processors, it will cause the processors to overheat. Accordingly, the electronic devices are usually equipped with a liquid cooling device for dissipating heat.

The liquid cooling device has a nozzle adapted to connect a pipe. The diameter of the nozzle is related to the heat dissipating efficiency of the liquid cooling device. In detail, the liquid cooling device with a larger diameter of the nozzle has better heat dissipation performance. Therefore, the nozzle will be replaced with a nozzle having larger diameter when the electronic device requires higher heat dissipation. However, it is inconvenient to replace the nozzle, thus users would rather buy a new liquid cooling device than replace the nozzle, but buying a new liquid cooling device costs much more money than replacing the nozzle.

SUMMARY

The present disclosure provides a liquid cooling device capable of solving the aforementioned problems.

One embodiment of the disclosure provides a liquid cooling device including a body. The body has a liquid outlet and a liquid inlet. The liquid outlet has a first internal thread on an inner wall thereof. The liquid inlet has a second internal thread on an inner wall thereof.

One embodiment of the disclosure provides a liquid cooling device including a body, a first thread adapter and a second thread adapter. The body has a liquid outlet and a liquid inlet. The first thread adapter is movably disposed on the liquid outlet. The first thread adapter has a first internal thread on an inner wall thereof. The second thread adapter is movably disposed on the liquid inlet. The second thread adapter has a second internal thread on an inner wall thereof.

One embodiment of the disclosure provides a liquid cooling device including a body. The body has a liquid passage, and the liquid passage has an internal thread on an inner wall thereof.

One embodiment of the disclosure provides a liquid cooling device including a body and a thread adapter. The body has a liquid passage. The thread adapter is movably disposed on the liquid passage. The thread adapter has an internal thread on an inner wall thereof.

According to the liquid cooling device as discussed above, because the liquid outlet, the liquid passage of the body, or the thread adapter has the internal thread on the inner wall thereof, a nozzle having a corresponding external thread is able to be screwed on the body or the thread adapter. Thus, it is convenient to replace nozzles with different diameters, and it could avoid the waste of buying a new liquid cooling device.

BRIEF DESCRIPTION OF THE DRAWINGS

The present disclosure will become more fully understood from the detailed description given here in below and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
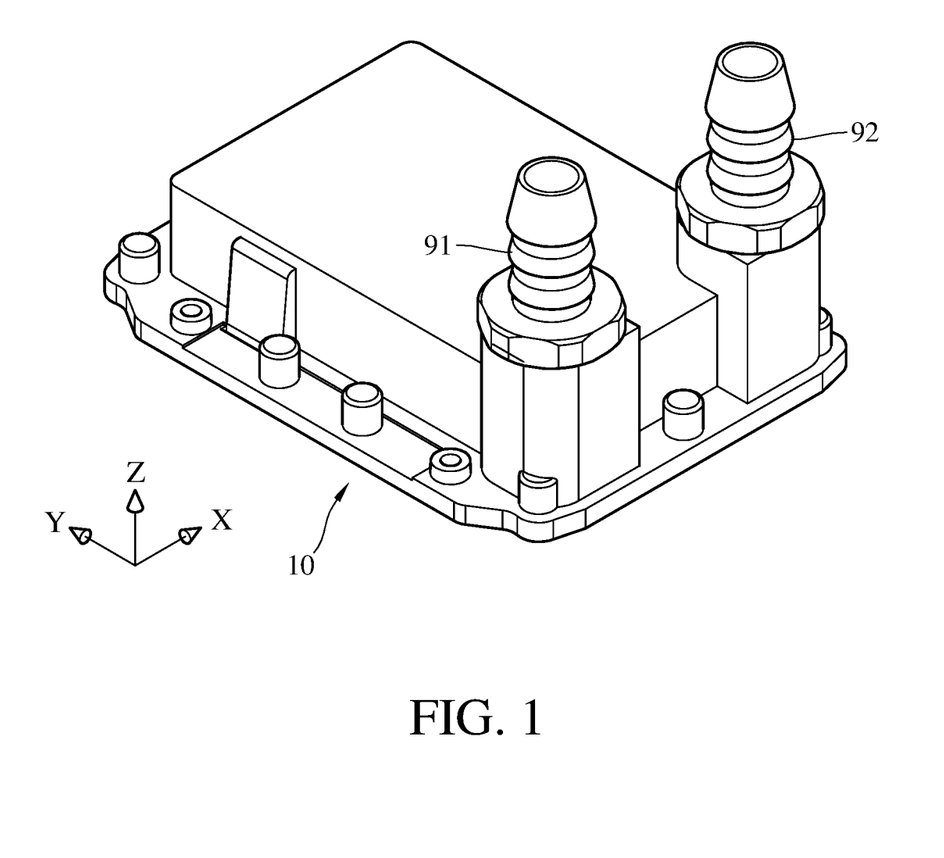
FIG. 1 is a perspective view of a liquid cooling device equipped with a liquid outlet nozzle and a liquid inlet nozzle in accordance with one embodiment of the disclosure.
Figure 2:
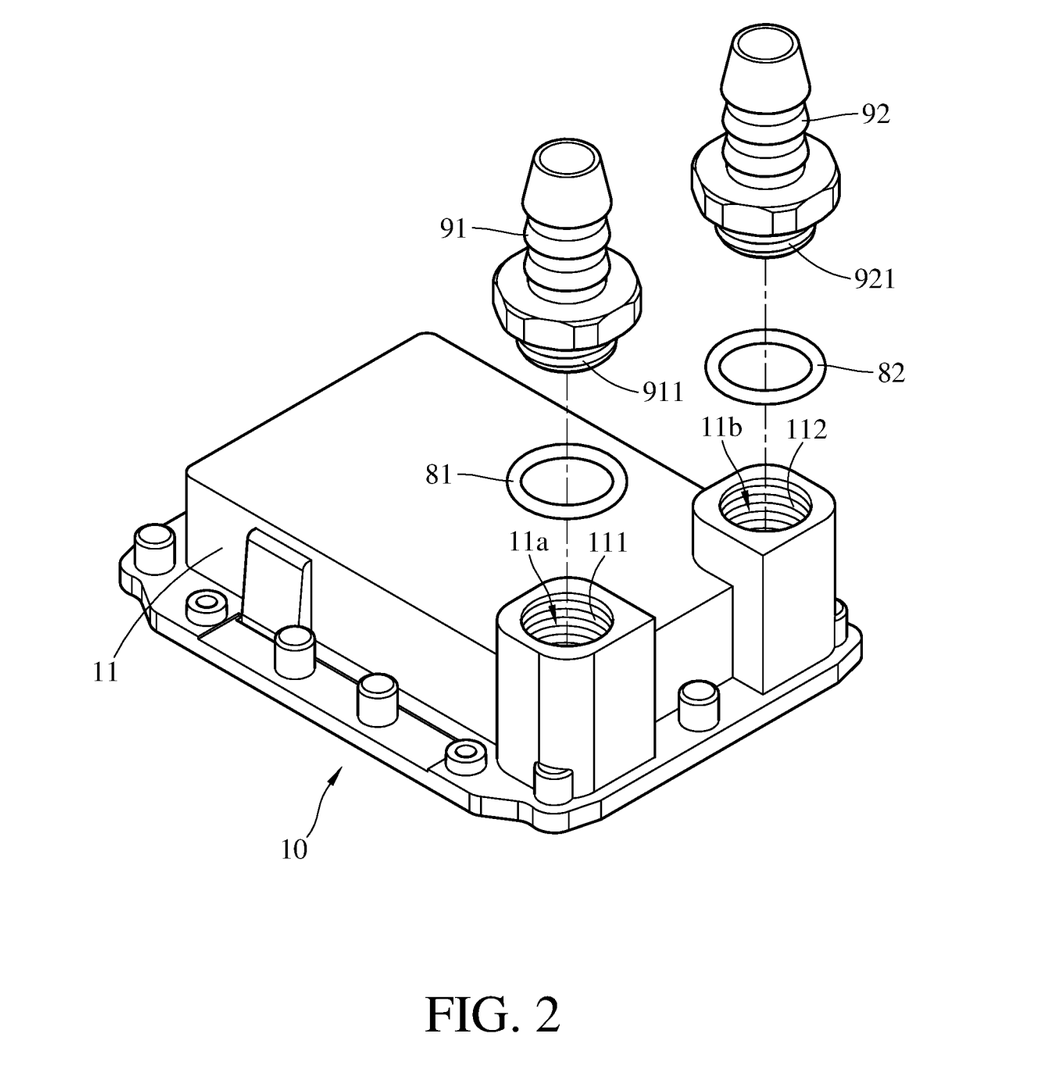
FIG. 2 is an exploded view of the liquid cooling device, the liquid outlet nozzle and the liquid inlet nozzle in FIG. 1.

Please refer to FIG. 1 and FIG. 2. FIG. 1 is a perspective view of a liquid cooling device equipped with a liquid outlet nozzle and a liquid inlet nozzle in accordance with one embodiment of the disclosure. FIG. 2 is an exploded view of the liquid cooling device, the liquid outlet nozzle and the liquid inlet nozzle in FIG. 1. In this embodiment, a liquid cooling device 10 is provided. The liquid cooling device 10 includes a body 11. A liquid outlet nozzle 91 and a first waterproof gasket 81 are removably disposed on the body 11, and a liquid inlet nozzle 92 and a second waterproof gasket 82 are removably disposed on the body 11.

Figure 3:
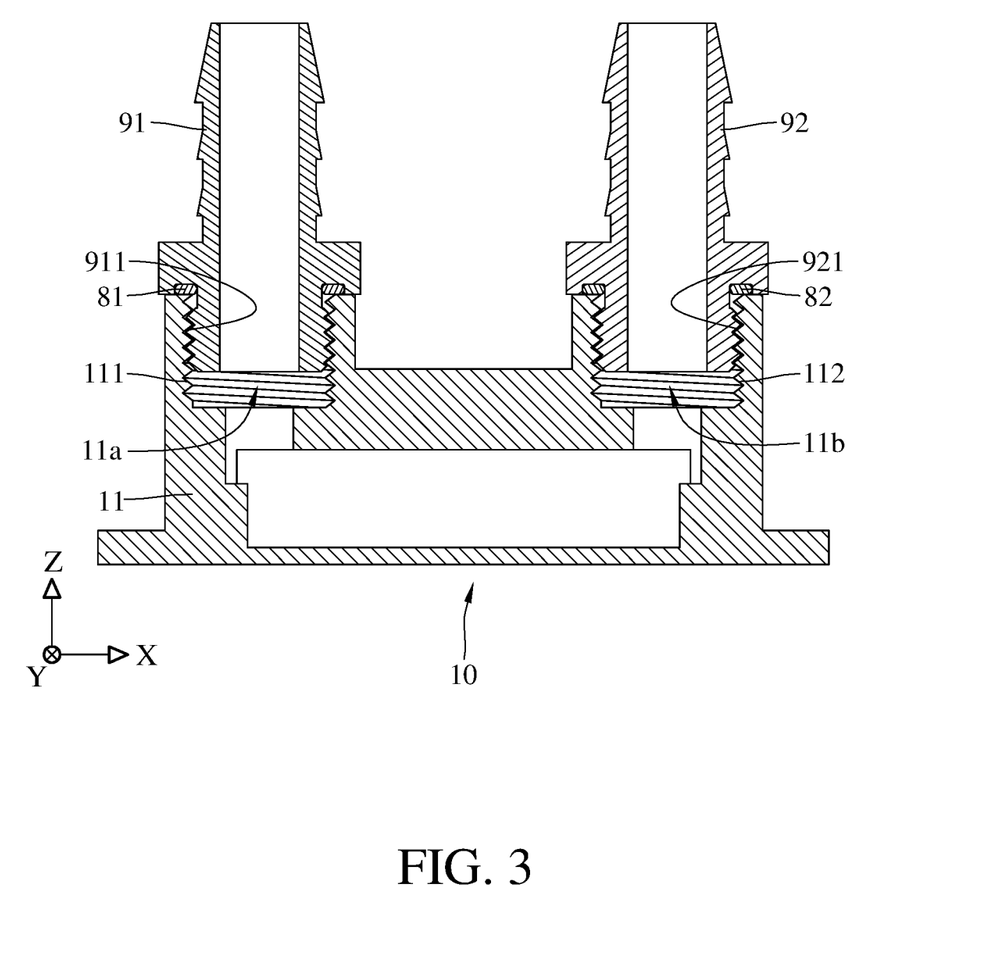
FIG. 3 is a cross-sectional view of the liquid cooling device equipped with a liquid outlet nozzle and a liquid inlet nozzle in FIG. 1.

Please refer to FIG. 2 and FIG. 3. FIG. 3 is a cross-sectional view of the liquid cooling device equipped with a liquid outlet nozzle and a liquid inlet nozzle in FIG. 1. The body 11 has a liquid outlet 11a and a liquid inlet 11b. The liquid outlet 11a and the liquid inlet 11b each is a liquid passage. The liquid outlet 11a has a first internal thread 111 on an inner wall thereof. The liquid inlet 11b has a second internal thread 112 on an inner wall thereof. Each of the first internal thread 111 and the second internal thread 112 is a G1/4 internal thread.

The liquid outlet nozzle 91 has a first external thread 911. The first external thread 911 matches with the first internal thread 111, and is able to be engaged with the first internal thread 111 so as to fix the liquid outlet nozzle 91 to the liquid outlet 11a of the body 11. The first waterproof gasket 81 is sleeved on the liquid outlet nozzle 91. When the liquid outlet nozzle 91 is screwed to the liquid outlet 11a, the first waterproof gasket 81 is pressed by the liquid outlet nozzle 91 and the body 11 from two sides so as to prevent the cooling liquid in the liquid cooling device 10 from leaking.

The liquid inlet nozzle 92 has a second external thread 921. The second external thread 921 matches with the second internal thread 112, and is able to be engaged with the second internal thread 112 so as to fix the liquid inlet nozzle 92 to the liquid inlet 11b of the body 11. The second waterproof gasket 82 is sleeved on the liquid inlet nozzle 92. When the liquid inlet nozzle 92 is screwed on the liquid inlet 11b, the second waterproof gasket 82 is pressed by the liquid inlet nozzle 92 and the body 11 from two sides so as to prevent the cooling liquid in the liquid cooling device 10 from leaking.

That is, the liquid outlet nozzle 91 and the liquid inlet nozzle 92 are detachably screwed on the body 11 of the liquid cooling device 10. Accordingly, it is convenient to replace the liquid outlet nozzle 91 and the liquid inlet nozzle 92.

In this embodiment, the liquid cooling device 10 does not include the liquid outlet nozzle 91, the liquid inlet nozzle 92, the first waterproof gasket 81 and the second waterproof gasket 82, but the present disclosure is not limited thereto. In other embodiments, the liquid cooling device may include the liquid outlet nozzle 91, the liquid inlet nozzle 92, the first waterproof gasket 81 and the second waterproof gasket 82.

In this embodiment, the liquid outlet 11a has the first internal thread 111, and the liquid inlet 11b has the second internal thread 112, but the present disclosure is not limited thereto. In other embodiments, only one of the liquid outlet and the liquid inlet has an internal thread.

Figure 4:
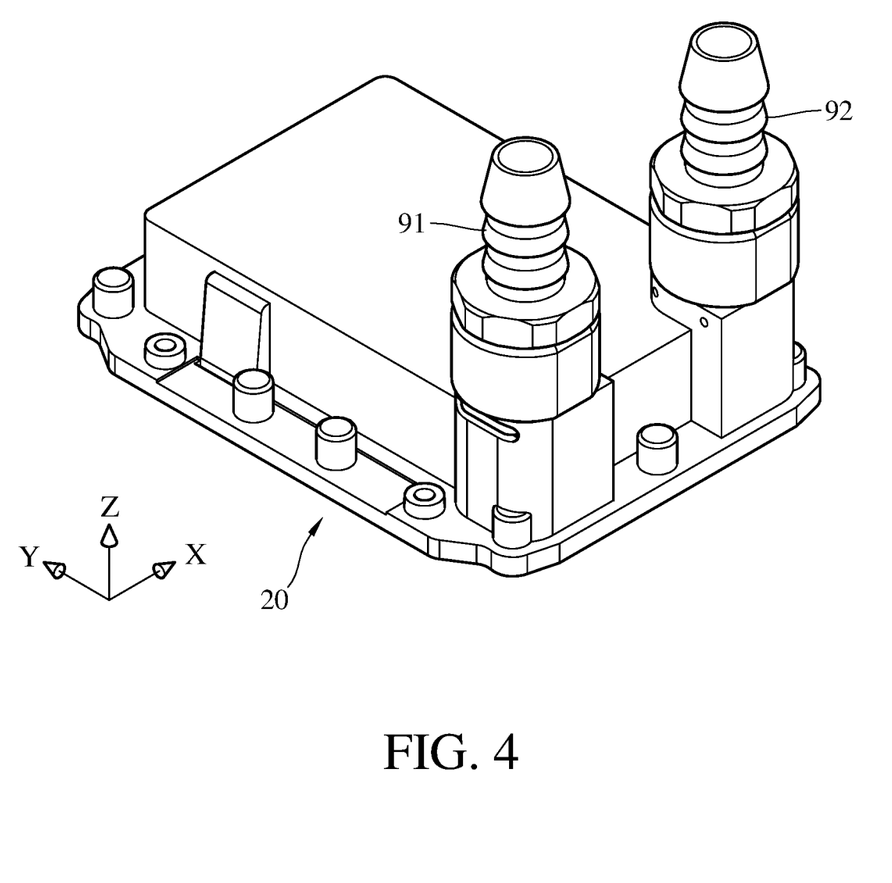
FIG. 4 is a perspective view of a liquid cooling device equipped with the liquid outlet nozzle and the liquid inlet nozzle in accordance with another embodiment of the disclosure.
Figure 5:
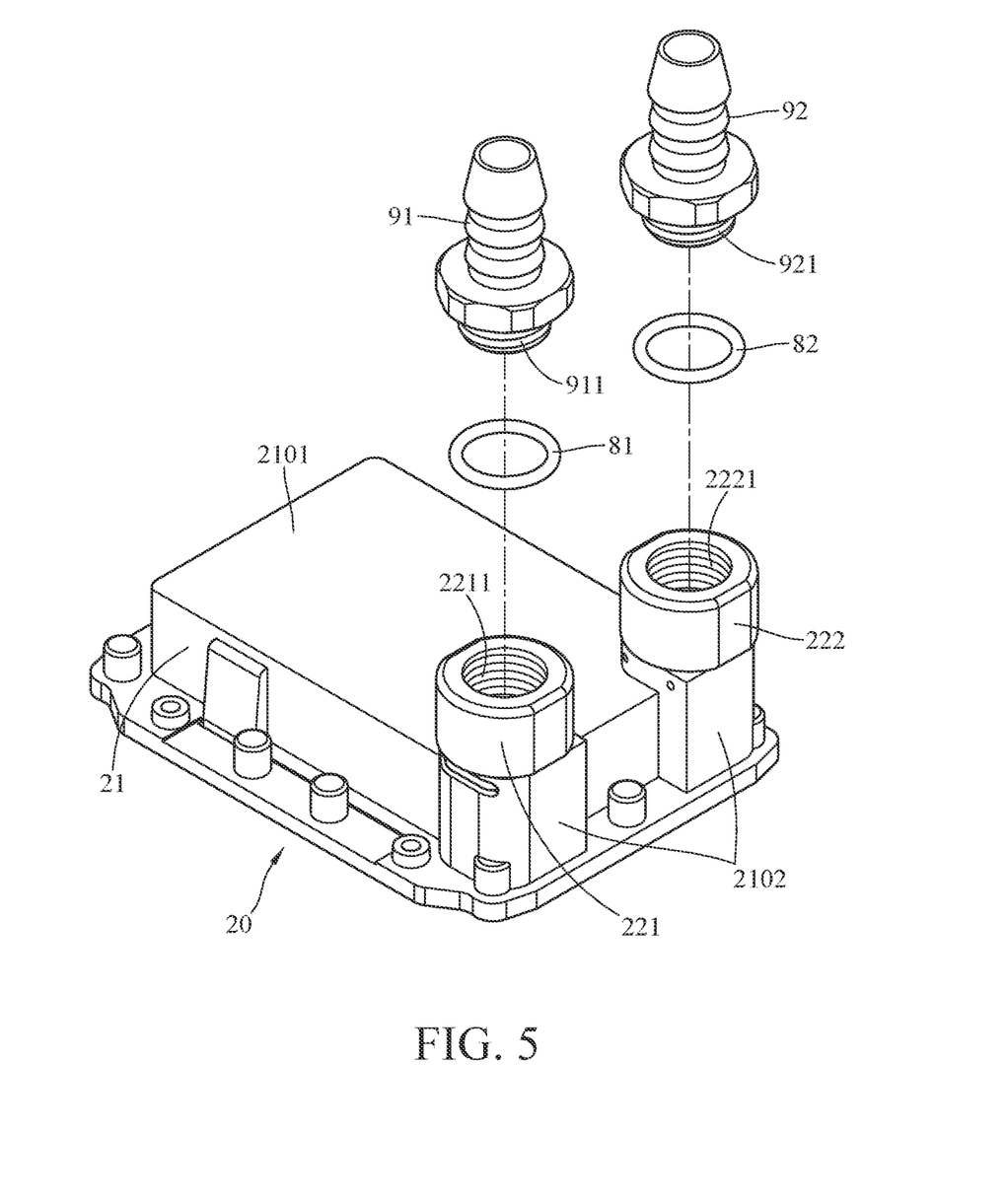
FIG. 5 is an exploded view of the liquid cooling device, the liquid outlet nozzle and the liquid inlet nozzle in FIG. 4.

Please refer to FIG. 4 and FIG. 5. FIG. 4 is a perspective view of a liquid cooling device equipped with the liquid outlet nozzle and the liquid inlet nozzle in accordance with another embodiment of the disclosure. FIG. 5 is an exploded view of the liquid cooling device, the liquid outlet nozzle and the liquid inlet nozzle in FIG. 4. In this embodiment, a liquid cooling device 20 is provided. The liquid cooling device 20 includes a body 21, a first thread adapter 221 and a second thread adapter 222. The body 21 includes a block portion 2101 and two post portions 2102, the two post portions 2102 being respectively arranged on two opposite sides of the block portion 2101. The body 21 has a liquid outlet 21a and a liquid inlet 21b, the liquid outlet 21a and the liquid inlet 21b are respectively formed so as to extend through the two post portions 2102. Each of the liquid outlet 21a and the liquid inlet 21b is a liquid passage. A central axis of the liquid outlet 21a and a central axis of the liquid inlet 21b are substantially parallel to the Z axis. The first thread adapter 221 is movably disposed on the liquid outlet 21a of the body 21. The second thread adapter 222 is movably disposed on the liquid inlet 21b of the body 21. The liquid outlet nozzle 91 and the first waterproof gasket 81 are removably disposed on the first thread adapter 221. The liquid inlet nozzle 92 and the second waterproof gasket 82 are removably disposed on the second thread adapter 222.

Figure 6:
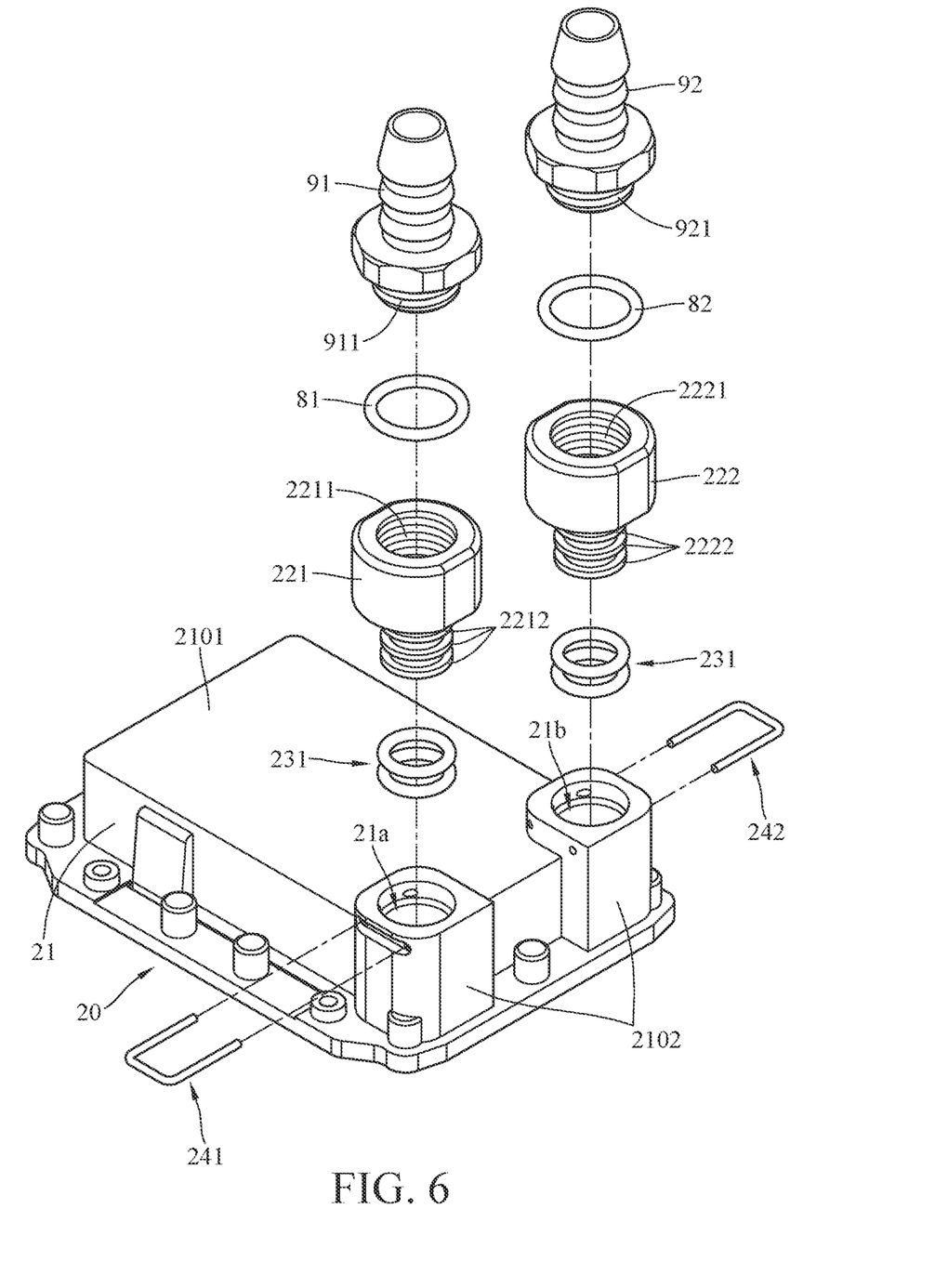
FIG. 6 is an exploded view of the liquid cooling device, the liquid outlet nozzle and the liquid inlet nozzle in FIG. 4.
Figure 7:
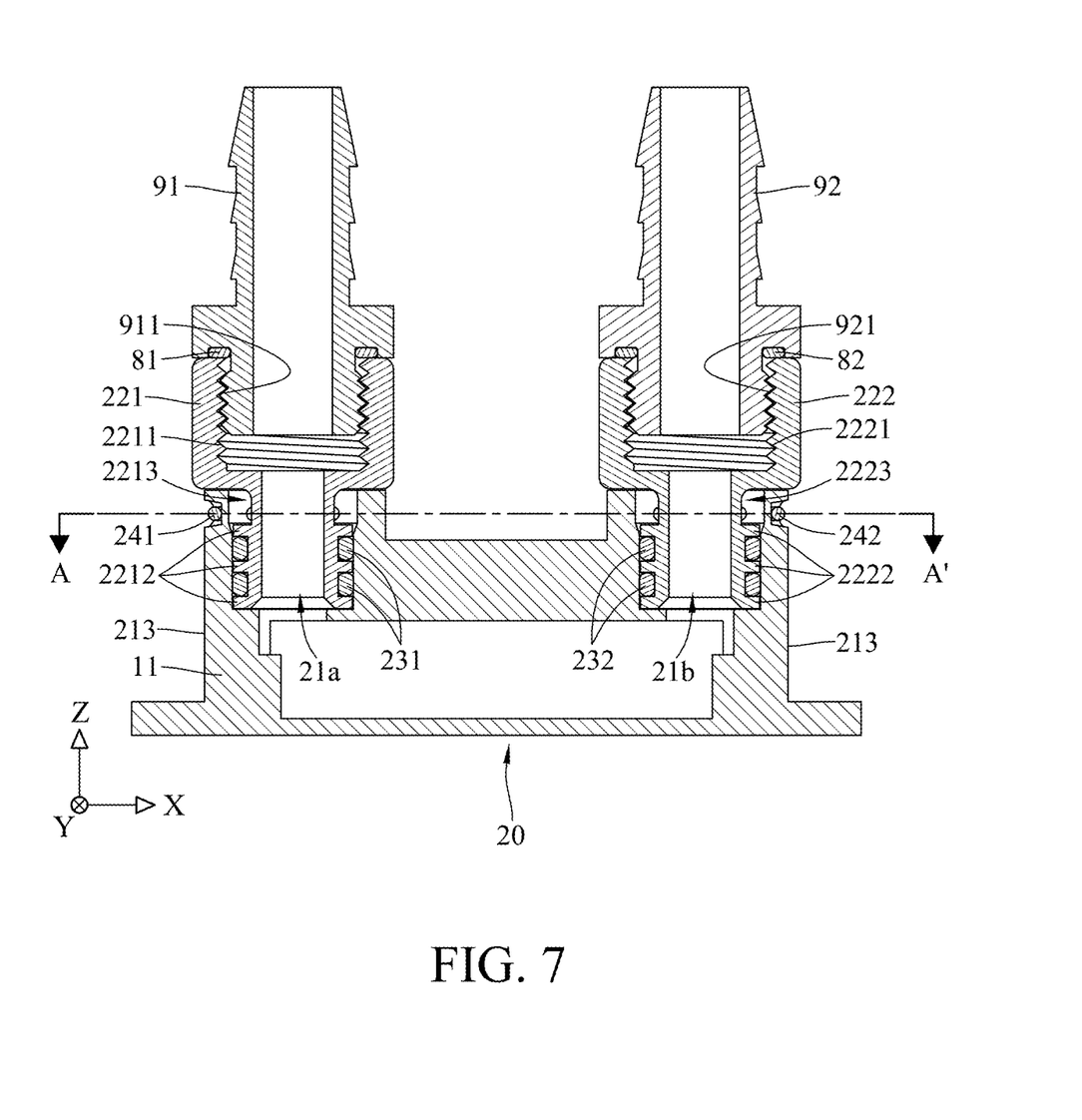
FIG. 7 is a cross-sectional view of the liquid cooling device equipped with a liquid outlet nozzle and a liquid inlet nozzle in FIG. 4.
Figure 8:
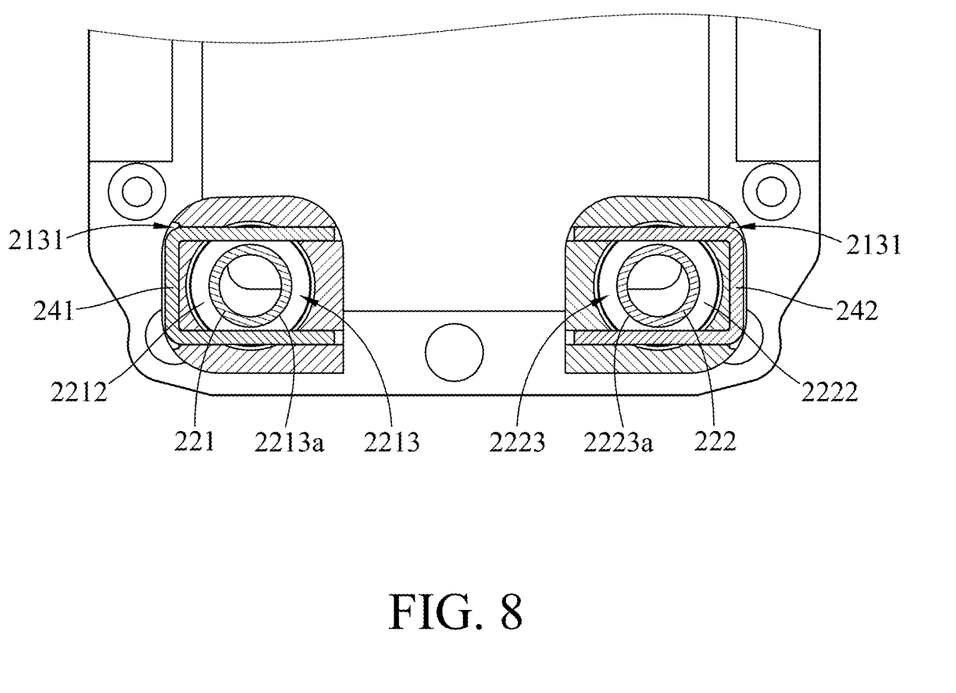
FIG. 8 is a partial cross-sectional view of the liquid cooling device in FIG. 4 taken along section line A-A'.

Please refer to FIG. 6 to FIG. 8. FIG. 6 is an exploded view of the liquid cooling device, the liquid outlet nozzle and the liquid inlet nozzle in FIG. 4. FIG. 7 is a cross-sectional view of the liquid cooling device equipped with a liquid outlet nozzle and a liquid inlet nozzle in FIG. 4. FIG. 8 is a partial cross-sectional view of the liquid cooling device in FIG. 4 taken along section line A-A'. In this embodiment, the liquid cooling device 20 further includes two third waterproof gaskets 231, two fourth waterproof gaskets 232, a first positioning pin 241 and a second positioning pin 242. In addition, the body 21 has at least four corners 211 at a flat top surface 212 thereof and two opposite side surfaces 213, where the flat top surface 212 is connected between the side surfaces 213, the liquid outlet 21a and the liquid inlet 21b are respectively arranged on two of the corners 211 of the flat top surface 212 so that the first thread adapter 221 and the second thread adapter 222 protrude outward from the flat top surface 212 and are respectively located at two of the corners 211 of the flat top surface 212. In addition, each of the side surfaces 213 of the body 21 has a through hole 2131, and the through holes 2131 of the side surfaces 213 are respectively connected to the liquid outlet 21a and the liquid inlet 21b and are respectively configured for the insertion of the first positioning pin 241 and the second positioning pin 242.

The first thread adapter 221 has a first internal thread 2211 on an inner wall thereof. The first internal thread 2211 is a G1/4 internal thread. The first thread adapter 221 includes three first annular protrusions 2212. The first thread adapter 221 has a first recession 2213 on an outer wall thereof, and the first recession 2213 is located on a side of the first annular protrusions 2212. From the view of FIG. 8, the first recession 2213 has a circular bottom surface 2213a. In this embodiment, the two third waterproof gaskets 231 are sleeved on the first thread adapter 221, and are respectively located between every two adjacent first annular protrusions 2212 so as to fix the third waterproof gaskets 231 in position so that the third waterproof gaskets 231 are not easy to slip off from the first thread adapter 221. In addition, the third waterproof gaskets 231 protrude further than the first annular protrusions 2212. Accordingly, when the first thread adapter 221 is disposed on the liquid outlet 21a, the third waterproof gaskets 231 are located between and pressed by the first thread adapter 221 and the inner wall of the liquid outlet 21a, such that the cooling liquid is prevented from leaking through the connection between the first thread adapter 221 and the body 21. It is noted that the number of the third waterproof gaskets 231 and the number of the first annular protrusions 2212 are not restricted. In other embodiments, the first thread adapter may have only one or more than two third waterproof gasket 231, and may have only one or more than three first annular protrusions 2212.

The second thread adapter 222 has a second internal thread 2221 on an inner wall thereof. The second internal thread 2221 is a G1/4 internal thread. The second thread adapter 222 includes three second annular protrusions 2222. The second thread adapter 222 has a second recession 2223 on an outer wall thereof, and the second recession 2223 is located on a side of the second annular protrusion 2222. From the top view as in FIG. 8, the second recession 2223 has a circular bottom surface 2223a. In this embodiment, the two fourth waterproof gaskets 232 are sleeved on the second thread adapter 222, and are respectively located between every two adjacent second annular protrusions 2222 so as to fix the fourth waterproof gaskets 232 in position so that the fourth waterproof gaskets 232 are not easy to slip off from the second thread adapter 222. In addition, the fourth waterproof gaskets 232 protrude further than the second annular protrusions 2222. Accordingly, when the second thread adapter 222 is disposed on the liquid outlet 21a, the fourth waterproof gaskets 232 press against the inner wall of the liquid inlet 21b, such that the cooling liquid is prevented from leaking through the connection between the second thread adapter 222 and the body 21. It is noted that the number of the fourth waterproof gaskets 232 and the number of the second annular protrusions 2222 are not restricted. In other embodiments, the second thread adapter may have only one or more than two fourth waterproof gasket 232, and may have only one or more than three second annular protrusion 2222.

The first positioning pin 241 penetrates through one of the through holes 2131 and the liquid outlet 21a, and is located in the first recession 2213 of the first thread adapter 221. The first positioning pin 241 interferes with the first annular protrusion 2212 of the first thread adapter 221 along the Z axis so as to prevent the first thread adapter 221 from being pulled out from the body 21. On the other hand, because the bottom surface 2213a of the first recession 2213 is circular, the first positioning pin 241 does not restrict the first thread adapter 221 from rotating around the central axis of the liquid outlet 21a. In other words, the first thread adapter 221 is rotatable with respect to the body 21, which is beneficial for assembling the liquid cooling device 20. In this embodiment, the first positioning pin 241 is in a U-shape, but the present disclosure is not limited thereto. In other embodiments, the first positioning pin 241 may be in a rod-shape.

The second positioning pin 242 penetrates through the other through hole 2131 and the liquid inlet 21b, and is located in the second recession 2223 of the second thread adapter 222. The second positioning pin 242 interferes with the second annular protrusion 2222 of the second thread adapter 222 along the Z axis so as to prevent the second thread adapter 222 from being pulled out from the body 21. On the other hand, because the bottom surface 2223a of the second recession 2223 is circular, the first positioning pin 241 does not restrict the second thread adapter 222 from rotating around the central axis of the liquid inlet 21b. In other words, the second thread adapter 222 is rotatable with respect to the body 21, which is beneficial for assembling the liquid cooling device 20. In this embodiment, the second positioning pin 242 is in a U-shape, but the present disclosure is not limited thereto. In other embodiments, the second positioning pin 242 may be in a rod-shape.

The liquid outlet nozzle 91 has a first external thread 911. The first external thread 911 is removably engaged with the first internal thread 2211 of the first thread adapter 221. The first waterproof gasket 81 is sleeved on the liquid outlet nozzle 91. When the liquid outlet nozzle 91 is screwed to the first thread adapter 221, the first waterproof gasket 81 is pressed by the liquid outlet nozzle 91 and the first thread adapter 221 from two sides so as to prevent the cooling liquid in the liquid cooling device from leaking.

The liquid inlet nozzle 92 has a second external thread 921. The second external thread 921 is removably engaged with the second internal thread 2221 of the second thread adapter 222 so as to fix the liquid inlet nozzle 92 to the second thread adapter 222. The second waterproof gasket 82 is sleeved on the liquid inlet nozzle 92. When the liquid inlet nozzle 92 is screwed to the second thread adapter 222, the second waterproof gasket 82 is pressed by the liquid inlet nozzle 92 and the second thread adapter 222 so as to prevent the cooling liquid in the liquid cooling device 20 from leaking.

That is, the liquid outlet nozzle 91 and the liquid inlet nozzle 92 are detachably screwed on the body 21 of the liquid cooling device 20. Accordingly, it is convenient to replace the liquid outlet nozzle 91 and the liquid inlet nozzle 92.

In this embodiment, the liquid cooling device 20 does not include the liquid outlet nozzle 91, the liquid inlet nozzle 92, the first waterproof gasket 81 and the second waterproof gasket 82, but the present disclosure is not limited thereto. In other embodiments, the liquid cooling device may include the liquid outlet nozzle 91, the liquid inlet nozzle 92, the first waterproof gasket 81 and the second waterproof gasket 82 stated above.

In this embodiment, the first thread adapter 221 with the first internal thread 2211 is movably disposed on the liquid outlet 21a of the body 21, and the second thread adapter 222 with the second internal thread 2221 is movably disposed on the liquid inlet 21b of the body 21, but the present disclosure is not limited thereto. In other embodiments, the liquid cooling device may only be equipped one thread adapter.

According to the liquid cooling device as discussed above, because the liquid inlet, the liquid passage of the body, or the thread adapter has the internal thread on the inner wall thereof, a nozzle having a corresponding external thread is able to be screwed on the body or the thread adapter. Thus, it is convenient to replace nozzles with different diameters, and it could avoid the waste of buying a new liquid cooling device.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A liquid cooling device, comprising:
a body, having a liquid inlet and a liquid outlet, wherein the body has a block portion and two post portions respectively arranged on two opposite sides of the block portion, the liquid inlet and the liquid outlet being respectively formed so as to extend through the two post portions and do not face opposite each other;
a first thread adapter, movably disposed on the liquid outlet, and the first thread adapter having a first internal thread on an inner wall thereof, and
a second thread adapter, movably disposed on the liquid inlet, and the second thread adapter having a second internal thread on an inner wall thereof, wherein the body has two opposite side surfaces and a flat top surface connected between the two side surfaces, the liquid inlet and the liquid outlet are arranged on the flat top surface, each of the side surfaces has a through hole, the through holes of the side surfaces are respectively connected to the liquid inlet and the liquid outlet and are respectively configured for the insertion of a first positioning pin and a second positioning pin for fixing the first thread adapter and the second thread adapter.

2. The liquid cooling device according to claim 1, further comprising a liquid outlet nozzle and a liquid inlet nozzle, the liquid outlet nozzle having a first external thread engaged with the first internal thread of the first thread adapter, and the liquid inlet nozzle having a second external thread engaged with the second internal thread of the second thread adapter.

3. The liquid cooling device according to claim 2, further comprising a first waterproof gasket and a second waterproof gasket, the first waterproof gasket sleeved on the liquid outlet nozzle and pressed by the liquid outlet nozzle and the first thread adapter, and the second waterproof gasket sleeved on the liquid inlet nozzle and pressed by the liquid inlet nozzle and the second thread adapter.

4. The liquid cooling device according to claim 1, further comprising at least one first waterproof gasket and at least one second waterproof gasket, the at least one first waterproof gasket sleeved on the first thread adapter pressed by the first thread adapter and the inner wall of the liquid outlet, and the at least one second waterproof gasket sleeved on the second thread adapter and pressed by the second thread adapter and the inner wall of the liquid inlet.

5. The liquid cooling device according to claim 4, wherein the first thread adapter comprises a plurality of first annular protrusions, the at least one first waterproof gasket is located between the two adjacent first annular protrusions and protrudes further than the plurality of annular protrusions, the second thread adapter comprises a plurality of second annular protrusions, the at least one second waterproof gasket is located between the two adjacent second annular protrusions and protrudes further than the plurality of second annular protrusions.

\* \* \* \* \*